(12) United States Patent
Cavazos Sepulveda et al.

(10) Patent No.: US 11,127,585 B2
(45) Date of Patent: Sep. 21, 2021

(54) OUT-OF-PLANE DEFORMABLE SEMICONDUCTOR SUBSTRATE, METHOD OF MAKING AN OUT-OF-PLANE DEFORMABLE SEMICONDUCTOR SUBSTRATE, AND AN IN-PLANE AND OUT-OF-PLANE DEFORMABLE SEMICONDUCTOR SUBSTRATE

(71) Applicant: KING ABDULLAH UNIVERSITY OF SCIENCE AND TECHNOLOGY, Thuwal (SA)

(72) Inventors: Adrián César Cavazos Sepulveda, Nuevo Leon (MX); Muhammad Mustafa Hussain, Austin, TX (US)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 103 days.

(21) Appl. No.: 16/341,533

(22) PCT Filed: Nov. 22, 2017

(86) PCT No.: PCT/IB2017/057309
§ 371 (c)(1),
(2) Date: Apr. 12, 2019

(87) PCT Pub. No.: WO2018/096454
PCT Pub. Date: May 31, 2018

(65) Prior Publication Data
US 2019/0371596 A1 Dec. 5, 2019

Related U.S. Application Data

(60) Provisional application No. 62/425,324, filed on Nov. 22, 2016.

(51) Int. Cl.
*H01L 21/02* (2006.01)
*H01L 23/00* (2006.01)
(Continued)

(52) U.S. Cl.
CPC .. *H01L 21/02035* (2013.01); *H01L 21/30604* (2013.01); *H01L 23/564* (2013.01); *H01L 29/0657* (2013.01)

(58) Field of Classification Search
CPC ............. H01L 23/5387; H01L 29/0657; H01L 21/02035; H01L 21/30604; H01L 23/564
See application file for complete search history.

(56) References Cited

U.S. PATENT DOCUMENTS

| 7,295,726 | B1 | 11/2007 | Milanovic et al. |
| 2003/0229981 | A1 | 12/2003 | Mahon |
| 2010/0116526 | A1* | 5/2010 | Arora ............... H01L 23/3121 174/254 |

FOREIGN PATENT DOCUMENTS

EP  2902294 A2  8/2015

OTHER PUBLICATIONS

International Search Report in corresponding/related International Application No. PCT/IB2017/057309, dated Feb. 22, 2018.
(Continued)

*Primary Examiner* — Latanya N Crawford Eason
(74) *Attorney, Agent, or Firm* — Patent Portfolio Builders PLLC

(57) ABSTRACT

An out-of-plane deformable semiconductor substrate includes a plurality of rigid portions having a first thickness and an out-of-plane deformable portion having a second thickness and connecting the plurality of rigid portions to each other. The second thickness is smaller than the first thickness. The out-of-plane deformable semiconductor substrate is monolithic.

12 Claims, 13 Drawing Sheets

(51) Int. Cl.
*H01L 29/06* (2006.01)
*H01L 21/306* (2006.01)

(56) References Cited

OTHER PUBLICATIONS

Lee, A.P., et al., "A Practical Microgripper by Fine Alignment, Eutectic Bonding and SMA Actuation," Sensors and Actuators, A: Physical, Jun. 1, 1996, vol. 54, No. 1-3, pp. 755-759, Elsevier BV, NL.

Written Opinion of the International Searching Authority in corresponding/related International Application No. PCT/IB2017/057309, dated Feb. 22, 2018.

* cited by examiner

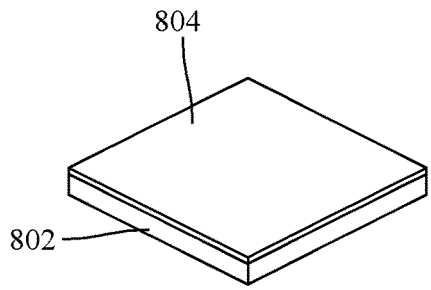 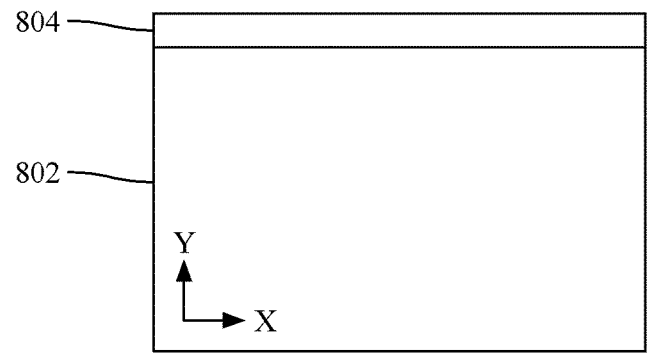
FIG. 8A1　　　　　　　FIG. 8A2
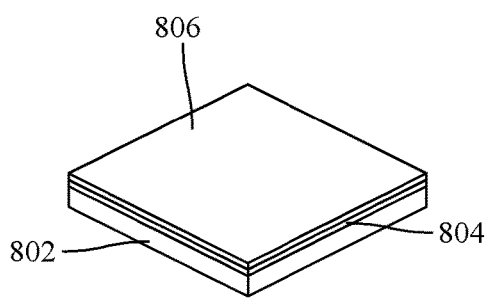 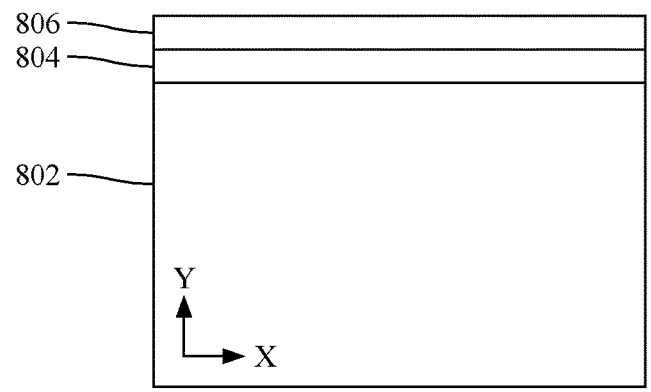
FIG. 8B1　　　　　　　FIG. 8B2
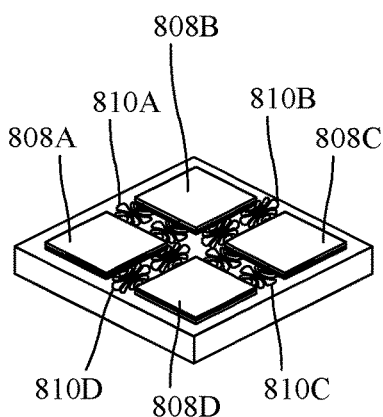 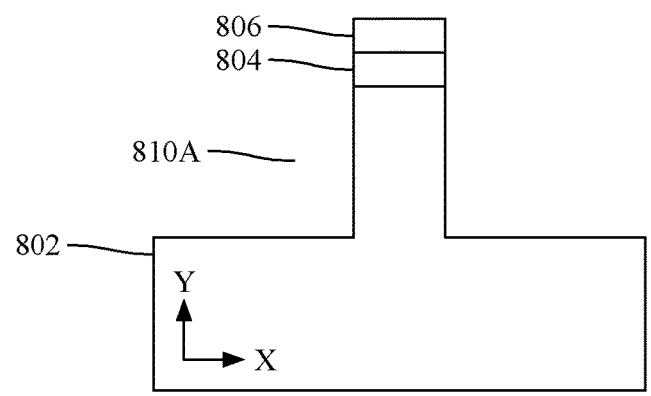
FIG. 8C1　　　　　　　FIG. 8C2

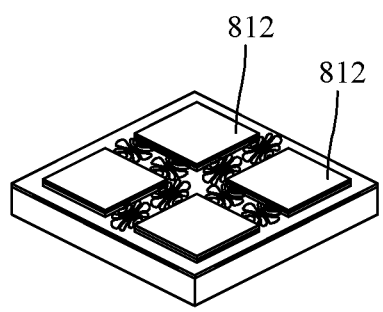
FIG. 8D1
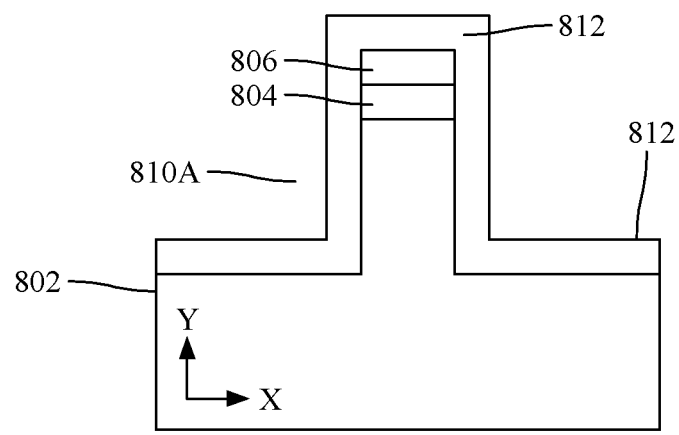
FIG. 8D2
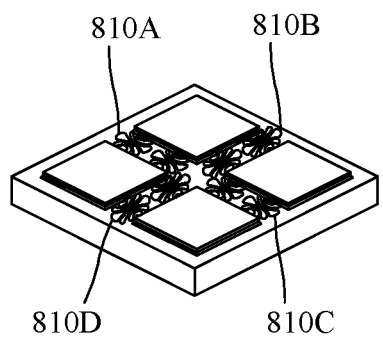
FIG. 8E1
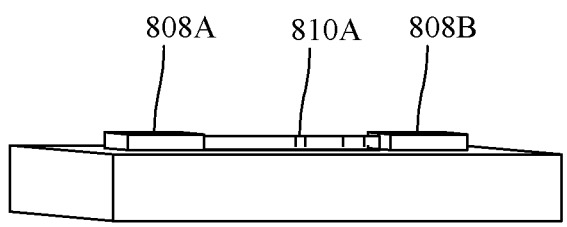
FIG. 8E2
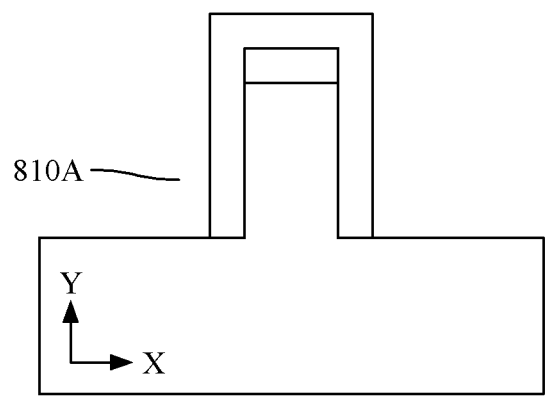
FIG. 8E3

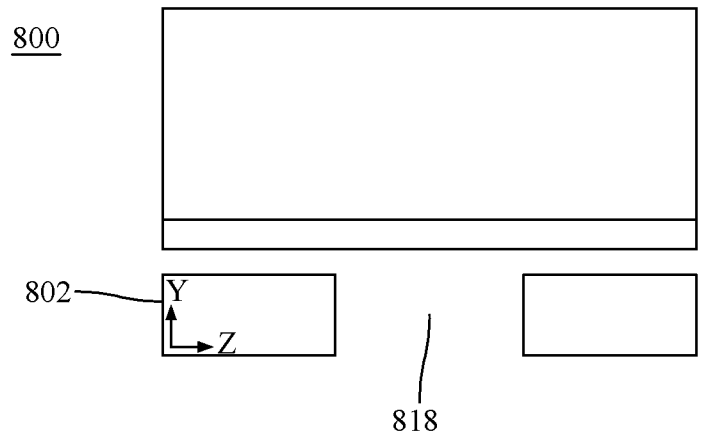
FIG. 8H1
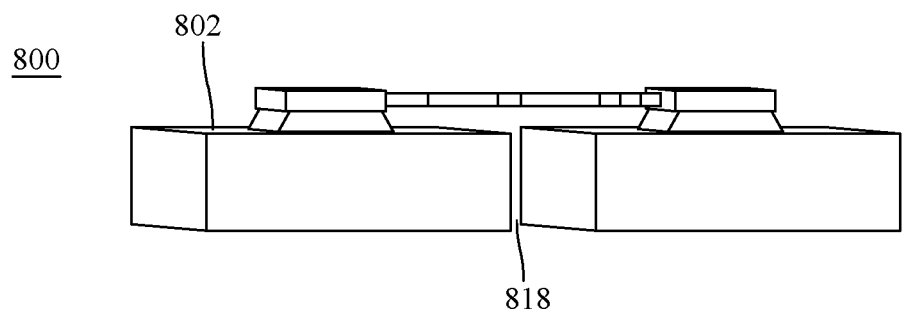
FIG. 8H2
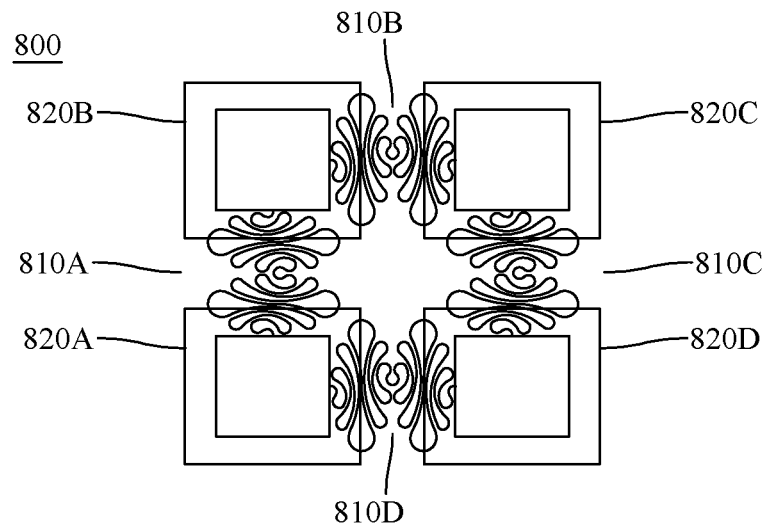
FIG. 8H3

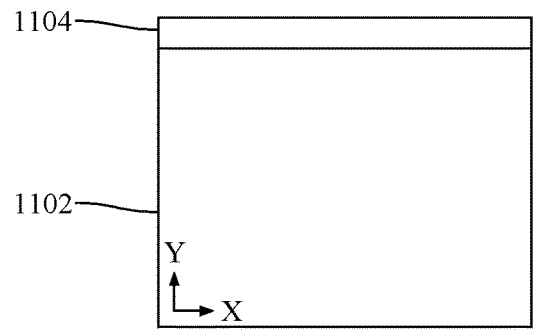
FIG. 11A
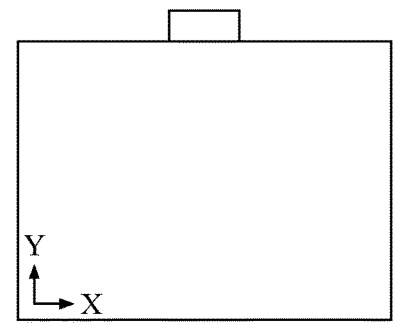
FIG. 11B
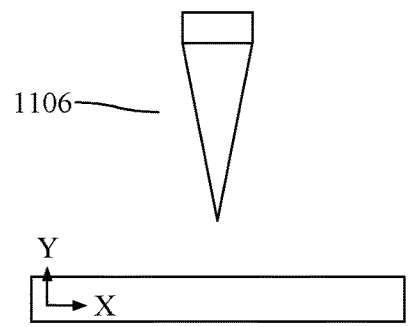
FIG. 11C
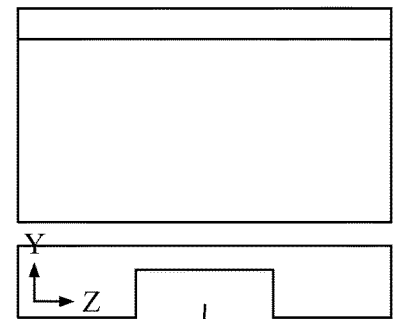
FIG. 11D
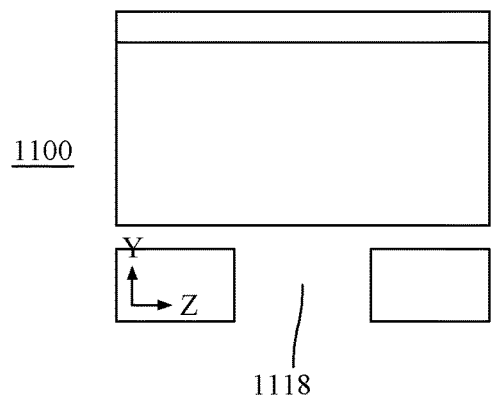
FIG. 11E1
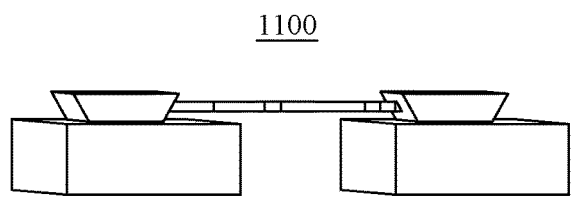
FIG. 11E2

OUT-OF-PLANE DEFORMABLE SEMICONDUCTOR SUBSTRATE, METHOD OF MAKING AN OUT-OF-PLANE DEFORMABLE SEMICONDUCTOR SUBSTRATE, AND AN IN-PLANE AND OUT-OF-PLANE DEFORMABLE SEMICONDUCTOR SUBSTRATE

CROSS-REFERENCE TO RELATED APPLICATIONS

This application is U.S. National Stage of International Application No. PCT/IB2017/057309 which claims priority and benefit from U.S. Patent Application No. 62/425,324, filed on Nov. 22, 2016, entitled "PHYSICALLY FLEXIBLE HETEROGENEOUS SUBSTRATES FOR SEMICONDUCTORS," the disclosures of which are incorporated here by reference.

BACKGROUND

Technical Field

Embodiments of the subject matter disclosed herein generally relate to an out-of-plane deformable semiconductor substrate, a method for making an out-of-plane deformable semiconductor substrate, and an in-plane and out-of-plane deformable semiconductor substrate.

Discussion of the Background

In-plane and out-of-plane deformable semiconductor substrates are currently being investigated for use in a variety of devices, such as wearable devices. As used herein, in-plane deformation is a stretching or compression and out-of-plane deformable is a flexing. Wearable devices arranged on an in-plane and out-of-plane deformable semiconductor substrate allow for new uses for devices, such as being integrated into clothing. Wearable devices that can be deformed in-plane and out-of-plane must be robust enough to withstand repeated out-of-plane and in-plane deformation, as well as provide a great amount of deformation out-of-plane.

Because silicon is a relatively rigid material, some research has focused on organic semiconductors having polymeric substrates, which provide the necessary robustness and out-of-plane deformation required for wearable devices. Polymeric substrates, however, have a lower mobility than conventional silicon substrates, for example, the mobility of silicon substrates is 10 cm$^2$ V$^{-1}$ s$^{-1}$ compared to 100 cm$^2$ V$^{-1}$ s$^{-1}$ for polymeric substrates. Further, thermally unstable polymeric substrates are typically not fully compatible with complimentary metal-oxide semiconductor (CMOS) production techniques, and thus require more complicated and expensive processing. The lack of compatibility with CMOS production techniques requires one production technique to form the polymeric substrate and then a different production technique for form electronic devices on the polymeric substrate.

It would be desirable to use silicon to form an in-plane and out-of-plane deformable semiconductor substrate due to its compatibility with CMOS production techniques, wide availability, semiconducting properties, mechanical properties, and thermal properties. The relative rigidity of silicon has typically required sophisticated engineering techniques to produce an in-plane and out-of-plane deformable silicon substrate. For example, one technique involves reducing the thickness of the entire silicon substrate to tens of microns. This thickness reduction constricts the internal strain of the bent substrate to the elastic region of silicon (i.e., silicon exhibits elastic deformation when it has a thickness on the order of tens of microns).

The reduced thickness can be achieved by detaching the top 5 μm of silicon from the rest of the bulk substrate with xenon difluoride (XeF$_2$) and then recycling the remaining silicon wafer. Another technique involves the use of expensive silicon-on-insulator (SOI) wafer that are protected by a pre-stressed polymeric substrate after fabrication. The silicon wafer is subsequently submerged in a hydrofluoric (HF) acid solution to dissolve the buried oxide (BOX) layer. In this technique, the device layer remains on the auxiliary polymeric substrate and is then transferred to other substrates. The viability of this technique is limited because it isolates each discrete device. Specifically, this technique produces small device islands that are out-of-plane deformable and separated from each other, thus requiring an additional connection between the small device islands, which is difficult to produce because the small device islands are fragile.

Simply thinning a silicon substrate, however, compromises its mechanical integrity, due in part to the fact that unprotected out-of-plane deformable silicon substrates are extremely fragile. Specifically, the large area-to-thickness ratio of a silicon substrate having a thickness on the order of tens of microns makes the out-of-plane deformable silicon substrate extremely vulnerable to damage during handling, which is why most out-of-plane deformation strategies rely on first building the device and then making it out-of-plane deformable.

Thus, there is a need for an in-plane and out-of-plane deformable semiconductor substrate that does not require sophisticated production techniques and is robust enough to handle in-plane and out-of-plane deformation without necessarily requiring additional support materials to provide robustness.

SUMMARY

According to an embodiment, there is an out-of-plane deformable semiconductor substrate, which includes a plurality of rigid portions having a first thickness and an out-of-plane deformable portion having a second thickness and connecting the plurality of rigid portions to each other. The second thickness is smaller than the first thickness. The out-of-plane deformable semiconductor substrate is monolithic.

According to another embodiment, there is a method of making an out-of-plane deformable semiconductor substrate. A monolithic, rigid semiconductor substrate is provided and patterned into a monolithic, out-of-plane deformable semiconductor substrate. The patterning forms a plurality of rigid portions having a first thickness and an out-of-plane deformable portion having a second thickness and connecting the plurality of rigid portions to each other. The second thickness is smaller than the first thickness.

According to yet another embodiment, there is an in-plane and out-of-plane deformable semiconductor substrate, which includes first and second rigid portions, each having a first thickness, a lower portion and an upper portion. The in-plane and out-of-plane deformable semiconductor substrate also includes an in-plane and out-of-plane deformable portion having a second thickness. The in-plane and out-of-plane deformable portion connects the upper portions of the first and second rigid portions to each other or the in-plane and out-of-plane deformable portion connects the lower portions of the first and second rigid portions to each other. The second thickness is smaller than the first thickness. The first and second rigid portions are spaced apart from each other. The out-of-plane deformable semiconductor substrate is monolithic.

BRIEF DESCRIPTION OF THE DRAWINGS

The accompanying drawings, which are incorporated in and constitute a part of the specification, illustrate one or more embodiments and, together with the description, explain these embodiments. In the drawings:

FIGS. 8A1, 8B1, 8C1, 8D1, 8E1, 8E2, 8F1, and 8H2 are perspective views of a method of making an in-plane and out-of-plane deformable semiconductor substrate according to an embodiment;

FIGS. 8A2, 8B2, 8C2, 8D2, 8E3, 8F2, 8G, and 8H1 are cross-sectional views of a method of making an in-plane and out-of-plane deformable semiconductor substrate according to an embodiment;

FIG. 8H3 is a top view of a schematic diagram of an in-plane and out-of-plane deformable semiconductor substrate made using the method of FIG. 7 according to an embodiment;

FIGS. 11A-11E2 are cross-sectional views of a method of making an in-plane and out-of-plane deformable semiconductor substrate using the method of FIG. 10 according to an embodiment.

DETAILED DESCRIPTION

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of an out-of-plane deformable semiconductor substrate. However, the embodiments discussed below are not limited to out-of-plane deformable semiconductor substrates and can be employed for any type of out-of-plane deformable substrate.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 1A:
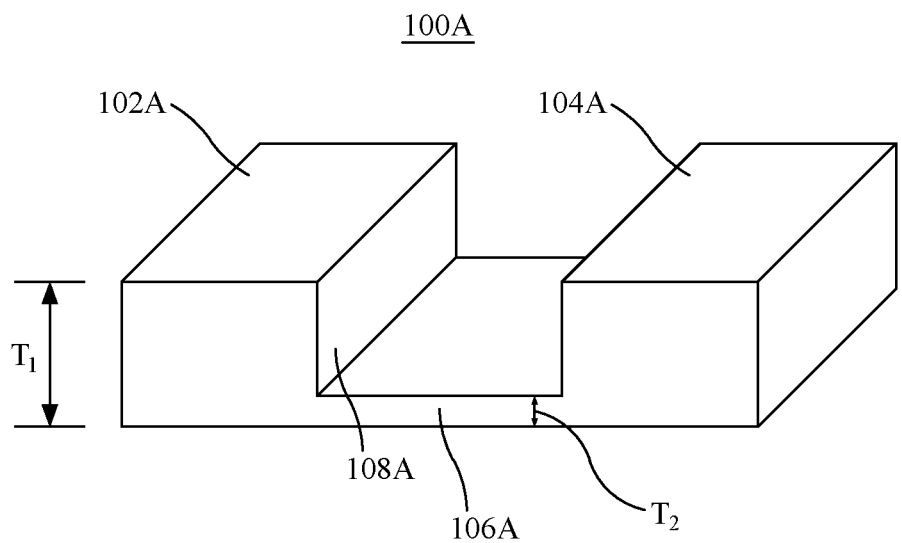
FIG. 1A is a perspective view of a schematic diagram of out-of-plane deformable semiconductor substrate according to an embodiment.

Referring now to FIG. 1A, an out-of-plane deformable semiconductor substrate 100A includes a plurality of rigid portions 102A and 104A having a first thickness $T_1$ and an out-of-plane deformable portion 106A having a second thickness $T_2$. The out-of-plane deformable portion 106A connects the plurality of rigid portions 102A and 104A to each other. The second thickness $T_2$ is smaller than the first thickness $T_1$. The out-of-plane deformable semiconductor substrate 100A is monolithic.

The plurality of rigid portions 102A and 104A are the portions of the substrate on which the electronic devices are formed or placed, and in some embodiments the out-of-plane deformable portion 106A can be metalized to provide an electrical coupling between devices on different rigid portions. Further, the rigid portions 102A and 104A allow for three-dimensional monolithic stacking of integrated circuits or other electronic devices without requiring through-silicon-vias (TSVs) through the substrate, and thus is particularly suitable for use with flip-chip bonding.

The thickness $T_1$ of rigid portions 102A and 104A is selected so that these portions exhibit sufficient rigidity to support an electronic device formed on these portions. The thickness $T_2$ of out-of-plane deformable portion 106A is selected so that it is able to deform out-of-plane (i.e., bend or move in the vertical direction in the figure). In one embodiment, the rigid portions 102A and 104A are 500-μm-thick and the out-of-plane deformable portion 106A is 30-μm-thick. An out-of-plane deformable semiconductor substrate having these thicknesses can achieve a bending to a radius of 130 μm. The bending radius of the out-of-plane deformable semiconductor substrate is not dependent on the overall substrate thickness, e.g., the thickness of the rigid portions, because the out-of-plane deformation is achieved using the out-of-plane deformable portion.

As will be appreciated from the discussion below, the out-of-plane deformable semiconductor substrate 100A is monolithic because the plurality of rigid portions 102A and 102B and the out-of-plane deformable portion 106A are formed from a common substrate. This is particularly advantageous because there is no need for additional material (e.g., adhesive) to join the out-of-plane deformable portion 106A to the plurality of rigid portions 102A and 104A. Further, the monolithic out-of-plane deformable semiconductor substrate exhibits good structural integrity because there is no requirement for additional mechanisms/materials to join the out-of-plane deformable portion 106A to the plurality of rigid portions 102A and 104A. Thus, as will be appreciated by those skilled in the art, a monolithic substrate, including the plurality of rigid portions 102A and 102B and the out-of-plane deformable portion 106A, is structurally and physically different than one in which the rigid portions and the out-of-plane deformable portions are formed separately.

Figure 1B:
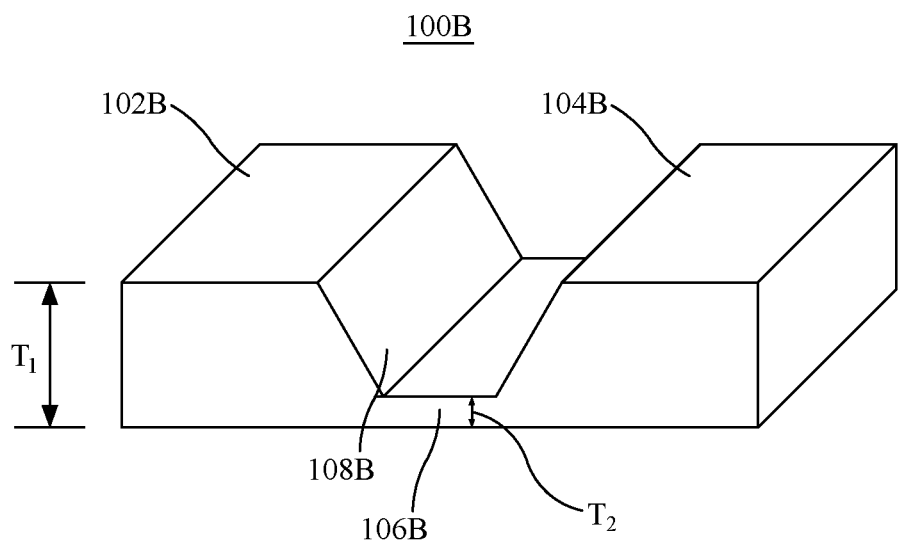
FIG. 1B is a perspective view of a schematic diagram of out-of-plane deformable semiconductor substrate according to an embodiment.

FIG. 1B illustrates an out-of-plane deformable semiconductor substrate 100B according to another embodiment. The out-of-plane deformable semiconductor substrate 100B in FIG. 1B is similar to the one in FIG. 1A in that the out-of-plane deformable semiconductor substrate 100B is monolithic and includes a plurality of rigid portions 102B and 104B connected by an out-of-plane deformable portion 106B. The difference between the out-of-plane deformable semiconductor substrates in FIGS. 1A and 1B is that in the rigid portions 102A and 104A of out-of-plane deformable semiconductor substrate 100A have sidewalls 108A (only one of which is visible in the figure) that are substantially perpendicular (i.e., ±5 degrees from perpendicular) to a top surface of the out-of-plane deformable portion 106A, whereas the rigid portions 102B and 104B of the out-of-plane deformable semiconductor substrate 100B have sidewalls 108B (only one of which is visible in the figure) that are non-perpendicular (i.e., >±5 degrees from perpendicular) to a top surface of out-of-plane deformable portion 106B. In the illustrated embodiment, the sidewalls 108B have an angle of approximately 54.74° relative to the top surface of the out-of-plane deformable portion 106A.

Figure 2A:
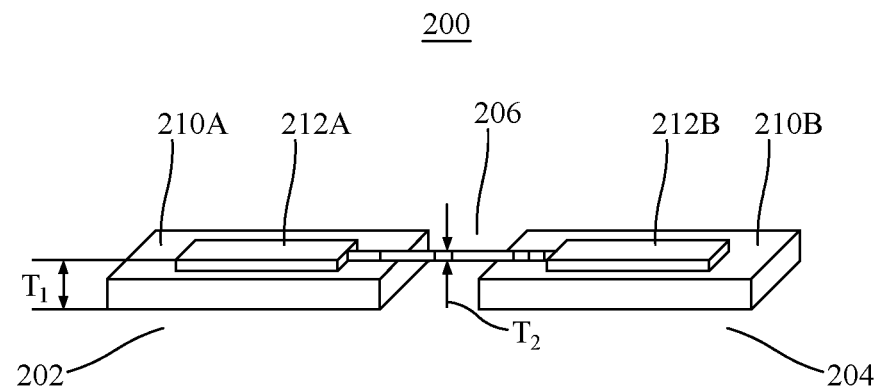
FIG. 2A is a perspective view of a schematic diagram of in-plane and out-of-plane deformable semiconductor substrate according to an embodiment.
Figure 2B:
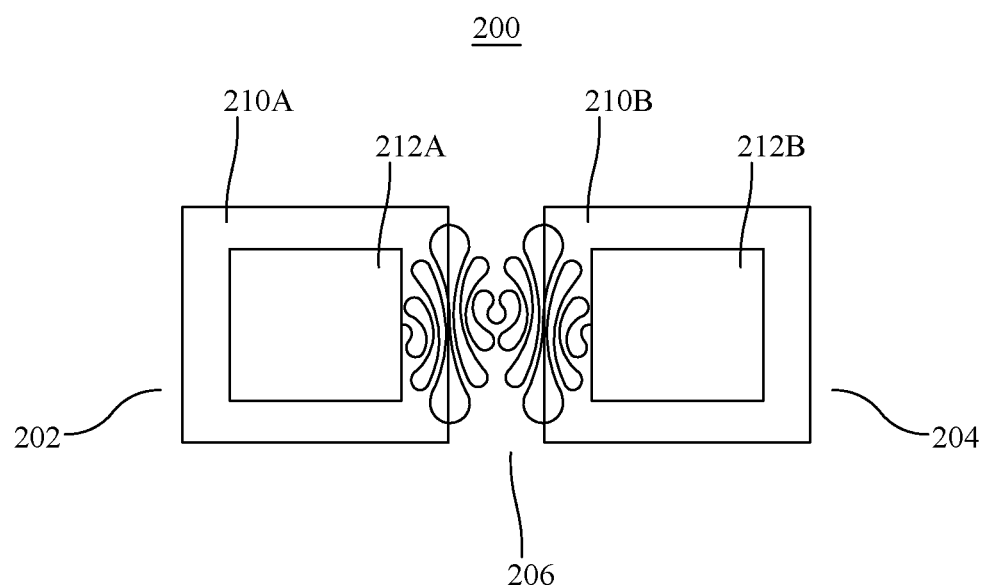
FIG. 2B is a top view of a schematic diagram of an in-plane and out-of-plane deformable semiconductor substrate according to an embodiment.

FIGS. 2A and 2B are schematic perspective and top-view diagrams of an in-plane and out-of-plane deformable semiconductor substrate 200, respectively, according to a further embodiment. The in-plane and out-of-plane deformable semiconductor substrate 200 includes first 202 and second 204 rigid portions, each having a first thickness $T_1$. The first 202 and second 204 rigid portions each have a lower portion 210A and 210B and an upper portion 212A and 212B. Although in the illustrated embodiment the upper portions 212A and 212B are smaller than the lower portions 210A and 210B, the upper portions 212A and 212B can be larger than the lower portions 210A and 210B, or the upper portions 212A and 212B can be the same size as the lower portions 210A and 210B. An in-plane and out-of-plane deformable portion 206 has a second thickness $T_2$ and connects the upper portions 212A and 212B of the first 202 and second 204 rigid portions to each other. The second thickness $T_2$ is smaller than the first thickness $T_1$.

Although in the illustrated embodiment the in-plane and out-of-plane deformable portion 206 connects the two upper portions 212A and 212B, the in-plane and out-of-plane deformable portion 206 can instead connect the two lower portions 210A and 210B. Further, multiple, parallel in-plane and out-of-plane deformable portions 206 can be formed, which can connect the two upper portions 212A and 212B to each other, the two lower portions 210A and 210B to each other, or the two upper portions 212A and 212B to each other and the two lower portions 210A and 210B to each other. The first 202 and second 204 rigid portions are spaced apart from each other. As with the embodiments discussed above, the in-plane and out-of-plane deformable semiconductor substrate 200, including the first 202 and second 204 rigid portions and the in-plane and out-of-plane deformable portion 206, is monolithic.

As illustrated in the top view of FIG. 2B, the in-plane and out-of-plane deformable portion 206 has a plurality of wave-like shapes arranged in a repeating pattern, which allows the portion to deform in-plane and the rigid portions 202 and 204 to move away from each other in the horizontal direction in the figure or move towards each other in the horizontal direction (which will be discussed in more detail below). Similar to the embodiments discussed above, the thickness $T_2$ of the in-plane and out-of-plane deformable portion 206 allows it to deform out-of-plane.

A method for making an out-of-plane deformable semiconductor substrate or an in-plane and out-of-plane deformable semiconductor substrate will now be discussed in connection with FIG. 3, as well as FIGS. 1A, 1B, 2A, and 2B. Initially, a monolithic, rigid semiconductor substrate is provided (step 305). The monolithic, rigid semiconductor substrate is then patterned to form a plurality of rigid portions 102A, 102B, 104A, 104B, 202, and 204 having a first thickness $T_1$ and an out-of-plane deformable portion 106A, 106B, and 206 having a second thickness $T_2$ and connecting the plurality of rigid portions 102A, 102B, 104A, 104B, 202, and 204 to each other (step 315). The second thickness $T_2$ is smaller than the first thickness $T_1$. As illustrated in FIG. 2A, the first thickness $T_1$ of rigid portions 202 and 204 include the thickness of the lower portions 210A and 210B and the thickness of the upper portions 212A and 212B.

Another method of forming an out-of-plane deformable semiconductor substrate will now be described in connection with FIGS. 4 and 5A-5C. Initially, a monolithic, rigid semiconductor substrate 550 is provided (step 405 and FIG. 5A). The monolithic, rigid semiconductor substrate 550 can have one or more devices formed or placed on the substrate 550 or can be a bare substrate. A protective layer 552 (e.g., a photoresist or hard mask) is applied to the monolithic, rigid semiconductor substrate 550 (step 410 and FIG. 5B). The monolithic, rigid semiconductor substrate 550 is then patterned to form a plurality of rigid portions 502A-502D having a first thickness and an out-of-plane deformable portion 506 connecting the plurality of rigid portion 502A-502D to each other (step 415 and FIG. 5C). For example, the protective layer 552 can be a silicon nitride hard mask and the monolithic, rigid semiconductor substrate 550 can be back etched using tetramethylammonium hydroxide (TMAH) while being on a holder, which protects the top segment.

Figure 5A:
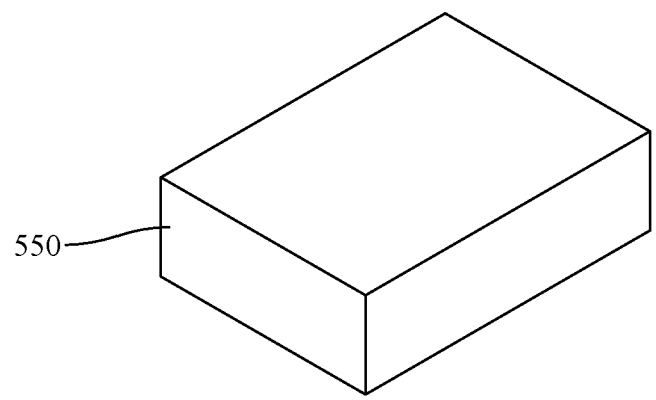
FIGS. 5A-5C are perspective views of a method of making an out-of-plane deformable semiconductor substrate according to an embodiment.
Figure 5B:
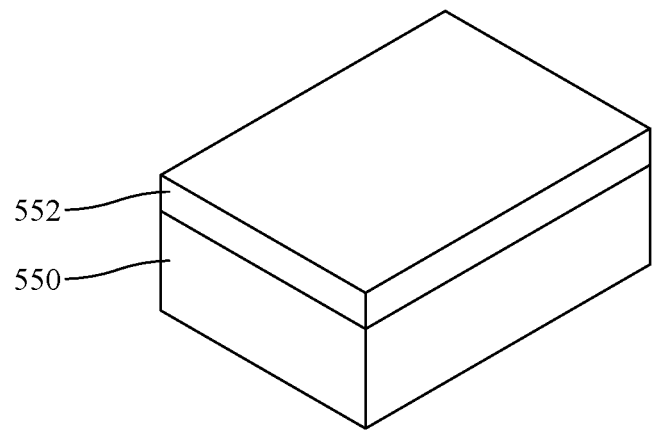
Figure 5C:
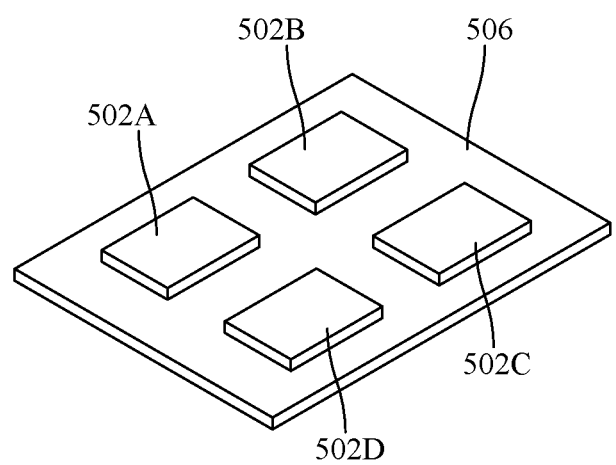
Figure 6A:
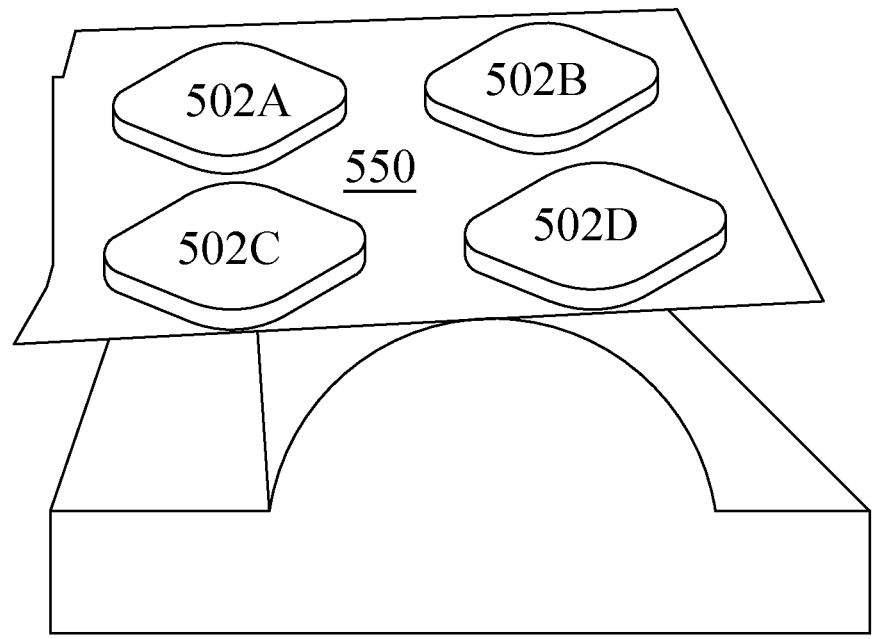
FIGS. 6A and 6B are photographs of an out-of-plane deformable semiconductor substrate made according to the method of FIGS. 3 and 4.
Figure 6B:
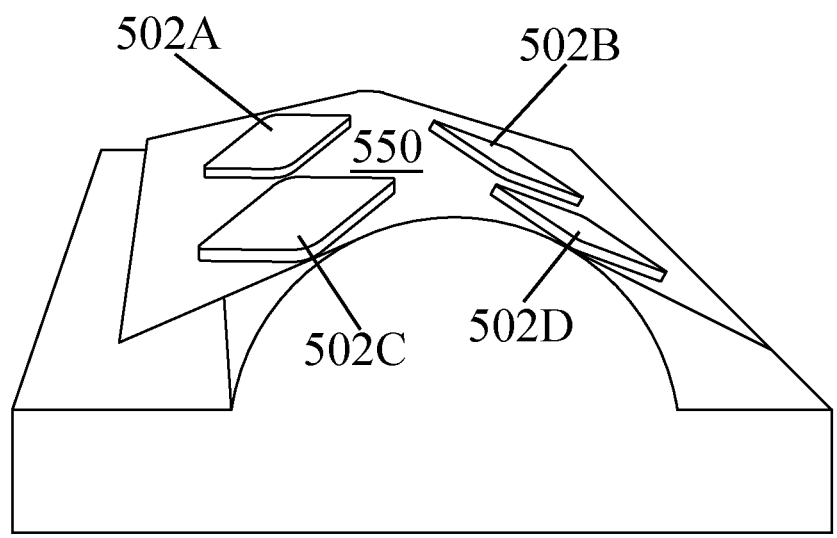
Figure 7:
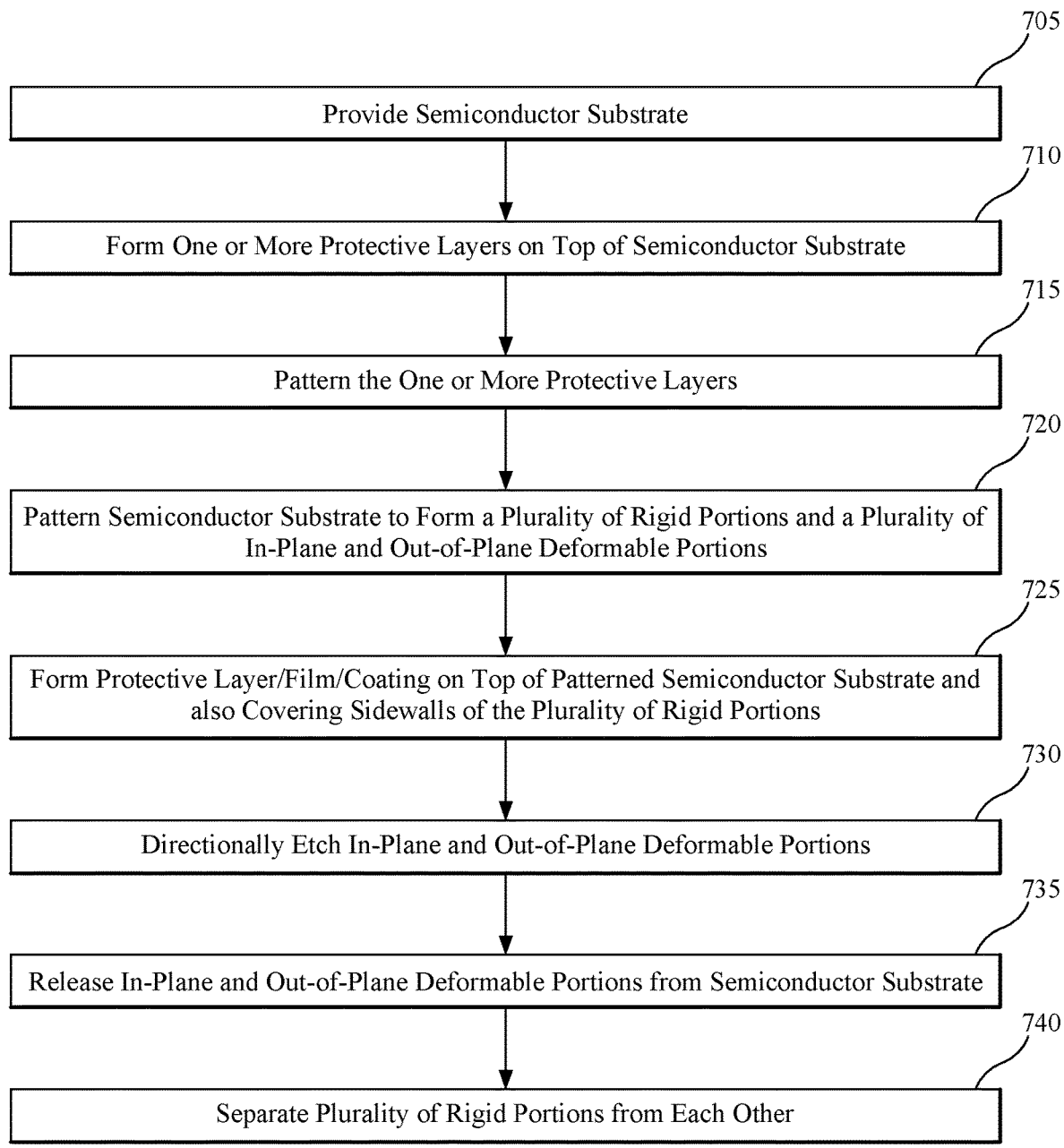
FIG. 7 is a flowchart of a method of making an in-plane and out-of-plane deformable semiconductor substrate according to an embodiment.

FIG. 5C illustrates the out-of-plane deformable portion 506 surrounding all sides of the plurality of rigid portions 502A-502D, including sides without an adjacent rigid portion. However, the out-of-plane deformable portion 506 can be limited to just the areas between adjacent ones of the plurality of rigid portions 502A and not extend past sides of the plurality of rigid portions 502A-502D that do not have an adjacent rigid portion. One or more devices can then be formed or placed on one or more of the plurality of rigid portions and/or on the out-of-plane deformable portion FIGS. 6A and 6B illustrate an out-of-plane deformable semiconductor substrate 550 with rigid portions 502A-502D formed with an angle of approximately 54.74° relative to the top surface of the out-of-plane deformable portion made using the methods described above. As illustrated in FIG. 6A, when no pressure is applied to the out-of-plane deformable semiconductor substrate 550, the substrate maintains its relatively planar shape, and thus the out-of-plane deformable portion is able to sustain the weight of a plurality of rigid portions 502A-502D without an additional supporting substrate. As illustrated in FIG. 6B, when pressure is applied to the out-of-plane deformable semiconductor substrate 550, the out-of-plane deformable portion deforms out-of-plane and the rigid portions 502A-502D retain their rigid shape.

A method of making an in-plane and out-of-plane deformable semiconductor substrate will now be described in connection with FIGS. 7 and 8A1-8H3. A semiconductor substrate 802 is provided and one or more protective layers 804 and 806 are formed on a top of the semiconductor substrate 802 (steps 705 and 710 and FIGS. 8A1, 8A2, 8B1, and 8B2). The protective layer 804 can be an oxide layer, such as a combination of silicon dioxide and aluminum oxide and protective layer 806 can be a photoresist layer. The silicon dioxide portion of the protective layer 804 can be formed by oxidation of the semiconductor substrate 802 at a high temperature to form a silicon oxide ($SiO_2$) film and the aluminum dioxide portion of protective layer 804 can be, for example, a 40 nm alumina ($Al_2O_3$) hard mask formed using atomic layer deposition (ALD). The substrate 802 can be, for example a 100 mm silicon wafer and the oxide film can be, for example, 500 µm thick.

The one or more protective layers 804 and 806 are then patterned to provide a protective layer for the subsequent etching of the substrate 802, i.e., portions of the protective layer(s) that overlay portions of the substrate 802 that will be etched are removed and the remaining portions of the protective layer(s) remain (step 715). The semiconductor substrate is then patterned to form the upper portions 808A-808D of the plurality of rigid portions and a plurality of in-plane and out-of-plane deformable portions 810A-810D (step 720 and FIGS. 8C1 and 8C2). It will be recognized that the plurality of in-plane and out-of-plane deformable portions 810A-810D are not yet in-plane and out-of-plane deformable because they are still attached to the underlying semiconductor substrate 802.

The thickness of the plurality of in-plane and out-of-plane deformable portions 810A-810D is then adjusted to attain a thickness allowing in-plane and out-of-plane deformability (steps 725 and 730). Specifically, a protective layer/film/coating 812 is formed on top of the patterned semiconductor substrate and also covers the sidewalls of the plurality of rigid portions (step 725 and FIGS. 8D1 and 8D2) and then directional etching is performed to remove the protective layer/film/coating 812 from the horizontal surfaces and reduce the thickness of the in-plane and out-of-plane deformable portions 810A-810D without removing the protective layer/film/coating 812 from the vertical surfaces (step 730 and FIGS. 8E1-8E3). It will be recognized that in FIGS. 8E1-8E3, the in-plane and out-of-plane deformable portion 810A is still connected to the semiconductor substrate 802 at this point in the processing. The directional etching removes protective layer/film/coating 812 for the horizontal surfaces as illustrated by comparing FIGS. 8D2 and 8E3. The portions of protective layer/film/coating 812 remaining after the directional etch act as a chemical protective layer for the subsequent isotropic etch in step 735. In an embodiment in which the final in-plane and out-of-plane deformable portions have a thickness of 30 µm, a 40 nm thick oxide film of alumina ($Al_2O_3$) is formed as the oxide film and the directional etching is performed using reactive ion etching (RIE).

The in-plane and out-of-plane deformable portions 810A-810D are then released from the semiconductor substrate, for example by an $XeF_2$-based isotropic etch (step 735 and FIGS. 8F1 and 8F2). Thus, as illustrated in FIGS. 8F1 and 8F2, a gap is created between the in-plane and out-of-plane deformable portions 810A-810D (only one of which is illustrated) and the underlying substrate 802. As illustrated in FIG. 8F1, in the illustrated embodiment, the in-plane and out-of-plane deformable portions 810A-810D (only one of which is illustrated) connect the upper portions 808A and 808B of two rigid portions to each other.

Figure 8G:
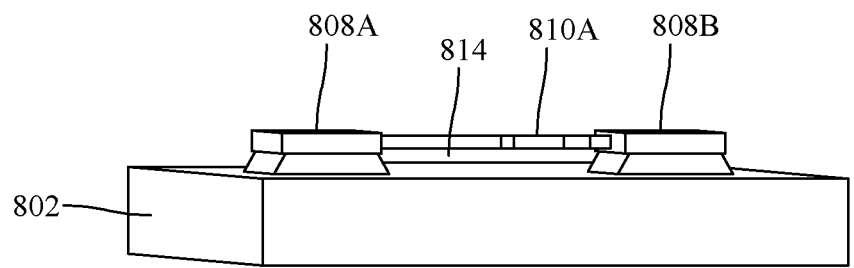
Figure 8G:
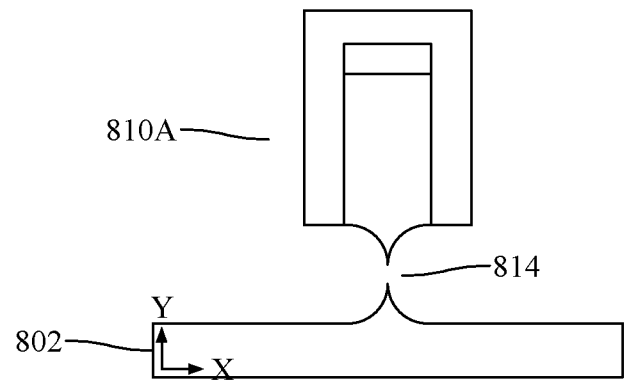
Figure 8G:
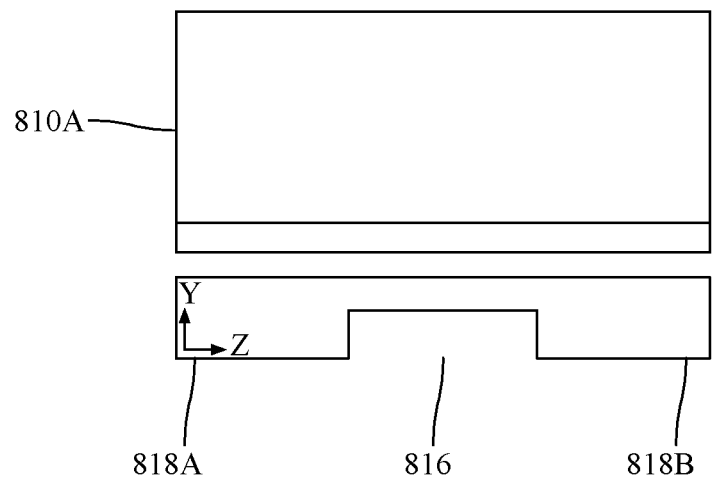

The plurality of rigid portions of substrate 802 are then separated from each other (step 740). For example, lines 816 can be engraved on the bottom side of the substrate 802 by moving a 1065 nm Ytterbium (YB) fiber laser along the crystallographic planes to promote and localize fracture initiation and propagation between lower portions 818A and 818B of the plurality of rigid portions (FIG. 8G). Engraving lines along the crystallographic planes helps insure that the out-of-plane deformable portions 810A-810D are undamaged by the separation of the rigid portions from each other. It will be appreciated that the illustration in FIG. 8G is a cross-sectional view in the Y-Z plane, whereas the previous cross-sectional views in the Y-X plane. The silicon substrate 802 is then cleaved to create a lateral space 818 between adjacent rigid portions 820A-820D (FIGS. 8H1 and 8H2) to result in an in-plane and out-of-plane deformable semiconductor substrate 800. Thus, as illustrated in FIG. 8H2 a lateral space 818 is created between the upper and lower portions of the rigid portions 820A-820D.

Figure 3:
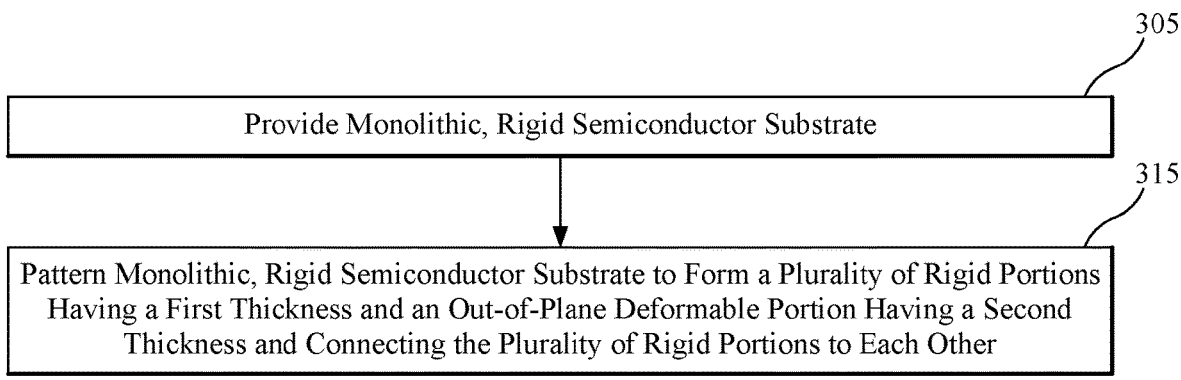
FIG. 3 is a flowchart of a method of making an out-of-plane deformable semiconductor substrate according to an embodiment.
Figure 4:
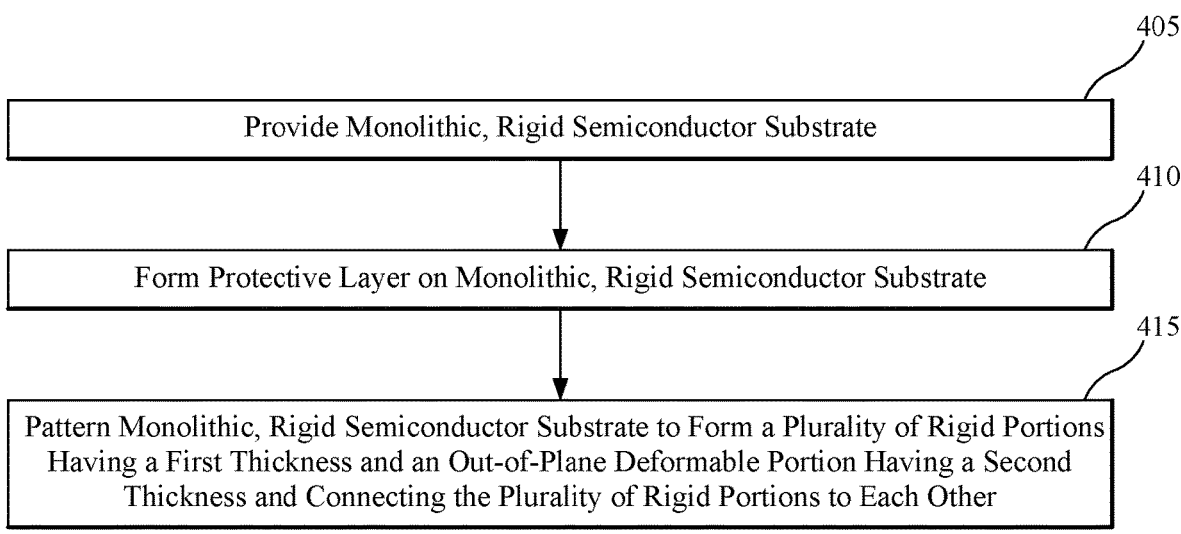
FIG. 4 is another flowchart of a method of making an out-of-plane deformable semiconductor substrate according to an embodiment.

FIG. 8H3 illustrates a top view of the in-plane and out-of-plane deformable substrate 800. As illustrated, adjacent ones of the plurality of rigid portions 820A-820D, including the respective upper and lower portions, are spaced apart from each other and are connected to each other via a respective in-plane and out-of-plane deformable portion 810A-810D.

Figure 9A:
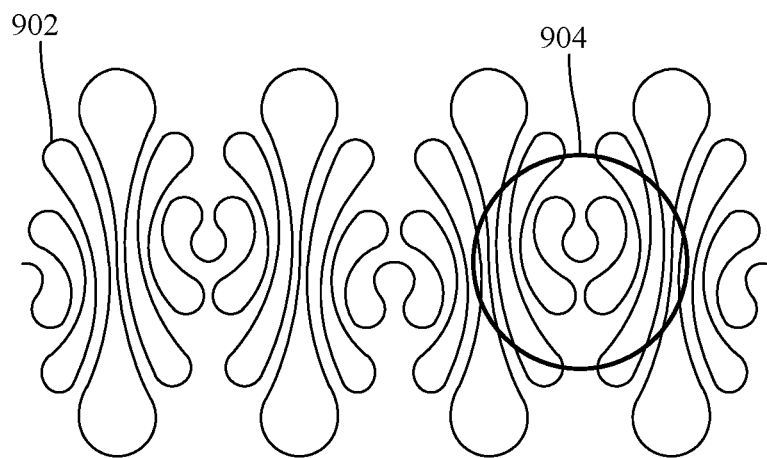
FIGS. 9A and 9B are top views of an in-plane and out-of-plane deformable portion according to an embodiment.
Figure 9B:
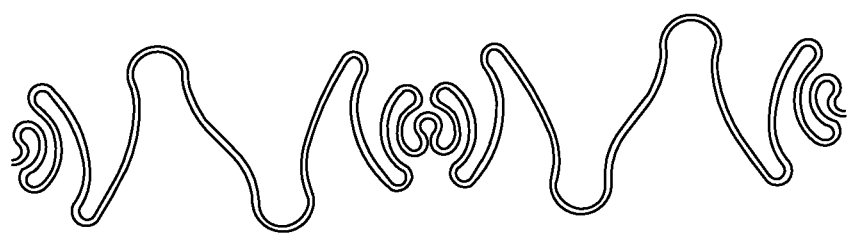

FIGS. 9A and 9B illustrate the in-plane deformation of an in-plane and out-of-plane deformable portion having a particular configuration. As illustrated, the in-plane and out-of-plane deformable portion has a plurality of wave-like shapes arranged in a repeating pattern. Specifically, the in-plane and out-of-plane deformable portion has a plurality of lamellae 902 (only one of which is labeled) arranged in a pattern of repeating spherulites 904. As illustrated in FIG. 9B, stretching the in-plane and out-of-plane deformable portion elongates it by increasing the separation between the lamellae 904. The pattern for the in-plane and out-of-plane deformable portion illustrated in FIGS. 9A and 9B is particularly advantageous because it does not tangle or self-intersect. In contrast, spiral shape interconnections can lead to self-intersection and may also tangle when bent. The lamellae 802 maximizes the arc length of the in-plane and out-of-plane deformable portion in relation to its length. The repeating pattern of spherulites areas 904 spread the lamellae when they are deformed laterally or out-of-plane. The in-plane and out-of-plane deformable portion can be not only bent but also twisted, which increases the flexibility of the overall semiconductor substrate.

It should be recognized that the particular configuration of the in-plane and out-of-plane deformable portion illustrated in the figures above is an example of one type of configuration and other configurations can be employed for the in-plane and out-of-plane deformable portion.

An in-plane and out-of-plane deformable semiconductor substrate made using the method described above in connection with FIGS. 7 and 8A1-8H3 was tested by first integrating an array with micro-light-emitting diodes (µLEDs), each on one of the rigid portions and interconnected by sputtering 50 nm of titanium (Ti) and 100 nm of gold (Au) on an in-plane and out-of-plane portion. A conductive resin was employed to adhere the µLEDs to the gold. The rigid portions 820A-820D are 500 µm thick and the out-of-plane deformable portions 810A-810D are 30 µm thick and 2 µm wide. The 500 µm thickness of the rigid portions 820A-820D provide mechanical support and the 30 µm thickness of the in-plane and out-of-plane deformable portions 810A-810D provides out-of-plane deformability.

The substrate was exposed to vapor hydrogen fluoride (HF) to remove the silicon dioxide for purposes of the in-plane and out-of-plane deformation tests. The ratio of the curve to spring width of the in-plane and out-of-plane deformable portion was approximately 50:1. Bending the in-plane and out-of-plane deformable portion so that two ends meet resulted in an internal radius of 130 μm and a maximum stress of 0.46 GPa, which corresponds to a strain of 0.136%. The difference between the arc length of the in-plane and out-of-plane deformable portion compared to its linear length between the two ends of the in-plane and out-of-plane deformable portion resulted in decreased internal strain because the strain was spread across the entire length of the in-plane and out-of-plane deformable portion. The disclosed structure of an in-plane and out-of-plane deformable portion showed a strain of 13.23 times smaller than that of a simulated conventional silicon bar having the same 30 μm thickness. Using rigid portions having an area of 2.1 mm by 0.85 mm and an in-plane and out-of-plane deformable portion having a 2 μm width demonstrated that the in-plane and out-of-plane deformable portion can be linearly stretched 490% of its original length.

Figure 9C:
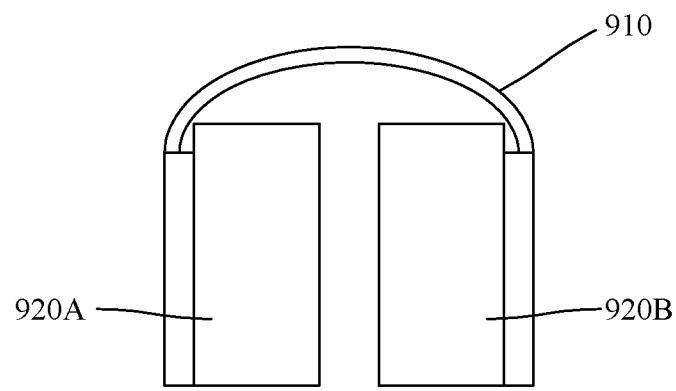
FIG. 9C is a schematic diagram of two rigid portions arranged in a parallel configuration by an in-plane and out-of-plane deformable portion according to an embodiment.

The in-plane and out-of-plane deformable portions also exhibited excellent mechanical integrity, which allowed for these portions to be spin coated with photoresist, cleaned with organic solvents and blow-dried with an $N_2$ gun, which would not be possible with other out-of-plane deformable silicon techniques. Further, it was found that a single in-plane and out-of-plane deformable portion can sustain the weight of more than one 500 μm rigid portion without requiring an additional supporting substrate. For example, as illustrated in FIG. 9C, the in-built strain of the in-plane and out-of-plane deformable portion 910 is sufficient to hold two attached rigid portions 920A and 920B in a vertical position and in a parallel orientation. In the embodiment illustrated in FIG. 9C, the in-plane and out-of-plane deformable portion 910 has a stressor layer applied to it to allow portion 910, in an undisturbed state (i.e., without external stress), to maintain the shape illustrated in FIG. 9C while supporting the rigid portions 920A and 920B. Further, depending upon implementation, the stressor layer allows portion 910, in an undisturbed state or a disturbed state (i.e., with external stresses), to maintain the rigid portions 920A and 920B in a non-parallel arrangement. It should be recognized that a stressor layer can also be employed on the out-of-plane portion or the in-plane and out-of-plane portion in any of the disclosed embodiments. It should be recognized that directional stiffness can be achieved by adjusting the thickness of the in-plane and out-of-plane deformable portion to change the amount of out-of-plane bending and by adjusting the width of the in-plane and out-of-plane deformable portion to change the amount of in-plane deformation.

Another method of making an in-plane and out-of-plane deformable semiconductor substrate will now be described in connection with FIGS. 10 and 11A-11E2. A semiconductor substrate 1102 is provided (step 1005) and a protective layer 1104 is formed on top of the semiconductor substrate 1102 (step 1010 and FIG. 11A). The protective layer 1104 is then patterned to remove the photoresist from areas surrounding the in-plane and out-of-plane deformable portions so as to expose portions of the substrate that will be removed in the subsequent etching step (step 1015 and FIG. 11B). The rigid portions and the in-plane and out-of-plane deformable portion 1106 are then patterned and the in-plane and out-of-plane deformable portion 1106 is released from the underlying substrate (step 1020 and FIG. 11C). The patterning of the rigid portions and the in-plane and out-of-plane deformable portion 1106 in this step is a patterning of the respective sidewalls. It should be noted that the sidewalls of the rigid portions and the in-plane and out-of-plane deformable portion 1106 could be patterned at a combination of etching angles, such as first performing a vertical etch and then performing a diagonal etch. This can allow a thicker in-plane and out-of-plane deformable portion 1106. Thus, in the method of FIG. 10 the in-plane and out-of-plane deformable portion 1106 is patterned and released in a single etching process (e.g., a Bosch/deep reactive-ion etching (DRIE) process), whereas in the method of FIG. 7 these are performed as separate steps.

Figure 10:
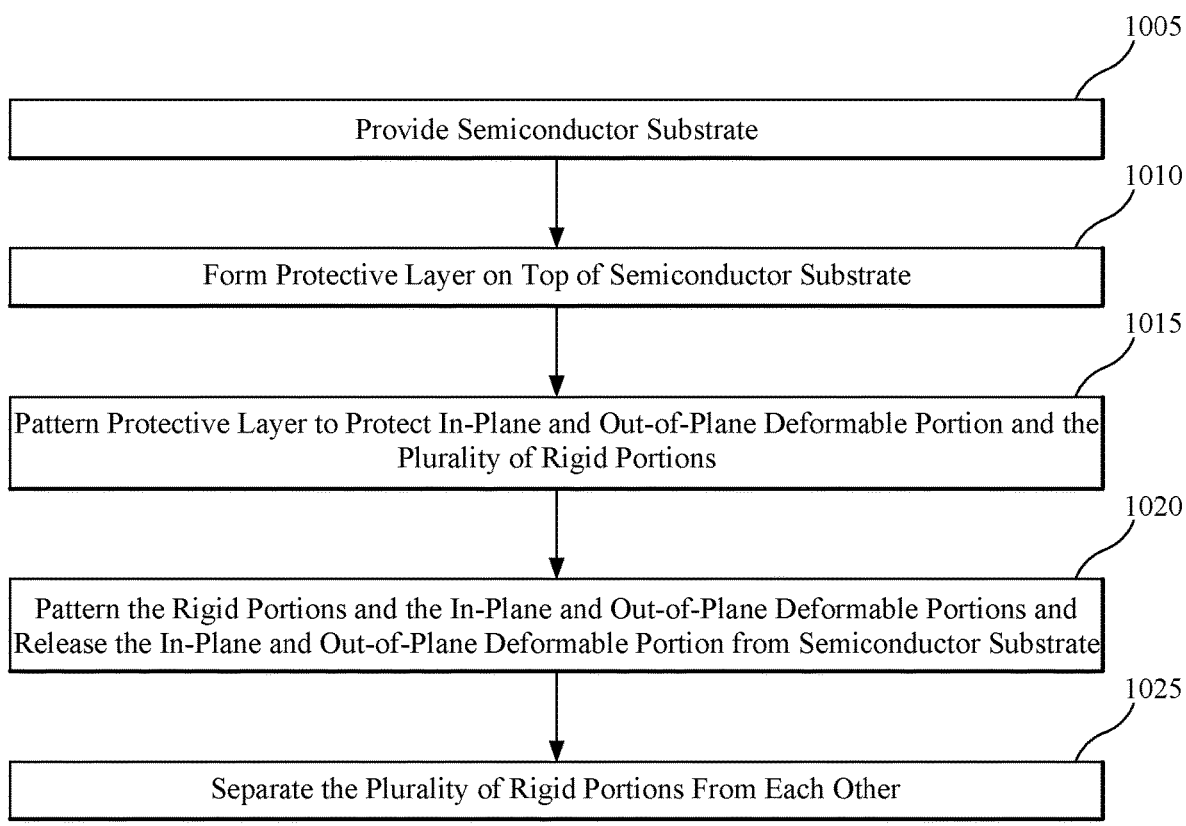
FIG. 10 is a flowchart of a method of making an in-plane and out-of-plane deformable semiconductor substrate according to an embodiment.

The plurality of rigid portions are then separated from each other (step 1025). For example, lines 1116 can be engraved on the bottom side of the substrate 1102 by moving a 1065 nm Ytterbium (YB) fiber laser along the crystallographic planes to promote and localize fracture initiation and propagation between the plurality of rigid portions (FIG. 11D). It will be appreciated that the illustration in FIG. 11D is a cross-sectional view in the Y-Z plane, whereas the previous cross-sectional views in the Y-X plane. The silicon substrate 1102 is then cleaved to create a lateral space 1118 between adjacent rigid portions (FIGS. 11E1 and 11E2) to result in an in-plane and out-of-plane deformable semiconductor substrate 1100. As will be appreciated by comparing the substrate 800 in FIG. 8H2 with the substrate 1100 in FIG. 11E2, the substrate 800 in FIG. 8H2 has angular upper portions 808A and 808B adjacent to the in-plane and out-of-plane deformable portion and the lower rectangular portions 802A and 802B, whereas this angular upper portion is not present in the substrate 1100 in FIG. 11E2 and end portions of the in-plane and out-of-plane deformable portion lays directly on the rectangular portion. The method of FIG. 10 is particularly advantageous because it is fully compatible with conventional CMOS processing techniques.

One particular application of the disclosed out-of-plane deformable substrate and in-plane and out-of-plane deformable substrate is as part of a silicon-based solar cell. Solar cells are typically rigid, which limits their size and use in wearable and mobile applications. Providing an out-of-plane deformable substrate or an in-plane and out-of-plane deformable substrate as disclosed, allows the use of larger sized solar cells that can be used in, for example, body-conforming configurations. The disclosed out-of-plane deformable substrate and in-plane and out-of-plane deformable substrate can also be used as part of a foldable tactile display, which improves the portability of displays and devices.

The disclosed out-of-plane deformable substrate and in-plane and out-of-plane deformable substrate can be used for destructible electronics. In this case, the out-of-plane deformable portion or in-plane and out-of-plane deformable portion could carry electronics to be destroyed and the rigid portions can be detached from these out-of-plane deformable portion or in-plane and out-of-plane deformable portion and any electronics on the detached rigid portions would not be destroyed. This is particularly useful, for example, for destroying memories and power supplies.

The disclosed out-of-plane deformable semiconductor substrate and in-plane and out-of-plane deformable semiconductor substrate can be employed in a variety of applications, including, for example, electronic devices, photovoltaics devices, electrochemical devices (e.g., batteries, fuel cells, electrolyzers and super capacitors), triboelectric devices, thermoelectric devices, micro-electro-mechanical systems, electrical devices, magnetic devices, optical devices, light emitting devices, and/or combinations thereof.

Due to the rigidity of the rigid portions on which these devices are formed or placed, these devices are not affected by the out-of-plane deformation or in-plane and out-of-plane deformation of the overall semiconductor substrate.

It should be recognized that in the discussion above, the references to in-plane deformation of the in-plane and out-of-plane deformable semiconductor substrate covers either expanding or compressing of the in-plane and out-of-plane deformable substrate.

The disclosed embodiments provide an out-of-plane deformable semiconductor substrate and method for making an out-of-plane deformable semiconductor substrate. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. An out-of-plane deformable semiconductor substrate, comprising:
    a plurality of rigid portions, each rigid portion of the plurality of rigid portions having a first thickness ($T_1$) and each rigid portion including an upper region and a lower region, the upper region having a smaller top surface area than the lower region; and
    an out-of-plane deformable portion having a second thickness ($T_2$) and connecting the plurality of rigid portions to each other, wherein the second thickness ($T_2$) is smaller than the first thickness ($T_1$),
    wherein the out-of-plane deformable semiconductor substrate is monolithic.

2. The out-of-plane deformable semiconductor substrate of claim 1, wherein the plurality of rigid portions each have sidewalls that are substantially perpendicular to a top surface of the out-of-plane deformable portion.

3. The out-of-plane deformable semiconductor substrate of claim 1, wherein the plurality of rigid portions each have sidewalls that are non-perpendicular to a top surface of the out-of-plane deformable portion.

4. The out-of-plane deformable semiconductor substrate of claim 1, wherein the out-of-plane deformable portion surrounds all sides of each of the plurality of rigid portions.

5. The out-of-plane deformable semiconductor substrate of claim 1, wherein the out-of-plane deformable portion comprises a plurality of in-plane and out-of-plane deformable portions, each of which connects one of the plurality of rigid portions to another of the plurality of rigid portions.

6. The out-of-plane deformable semiconductor substrate of claim 5, wherein the plurality of in-plane and out-of-plane deformable portions each have wave-like shape in an undisturbed state, and wherein the wave-like shape expands in a stretched state.

7. The out-of-plane deformable semiconductor substrate of claim 1, wherein the out-of-plane deformable portion, in an undisturbed state, maintains the plurality of rigid portions in a planar arrangement.

8. The out-of-plane deformable semiconductor substrate of claim 1, wherein the out-of-plane deformable portion includes a stressor layer, which in an undisturbed state, maintains the plurality of rigid portions in a non-planar arrangement.

9. An in-plane and out-of-plane deformable semiconductor substrate, comprising:
    first and second rigid portions, each having a first thickness ($T_1$), a lower portion and an upper portion, the upper portion having a smaller top surface area than the lower portion; and
    an in-plane and out-of-plane deformable portion having a second thickness ($T_2$), wherein the in-plane and out-of-plane deformable portion connects the upper portions of the first and second rigid portions to each other or the in-plane and out-of-plane deformable portion connects the lower portions of the first and second rigid portions to each other, wherein the second thickness ($T_2$) is smaller than the first thickness ($T_1$),
    wherein the first and second rigid portions are spaced apart from each other, and
    wherein the in-plane and out-of-plane deformable semiconductor substrate is monolithic.

10. The in-plane and out-of-plane deformable semiconductor substrate of claim 9, wherein the in-plane and out-of-plane deformable portion has wave-like shape in an undisturbed state, and wherein the wave-like shape expands in a stretched state.

11. The in-plane and out-of-plane deformable semiconductor substrate of claim 9, wherein the in-plane and out-of-plane deformable portion has a stressor layer, which in an undisturbed state, maintains the plurality of rigid portions in a parallel or non-parallel arrangement.

12. The in-plane and out-of-plane deformable semiconductor substrate of claim 9, wherein the in-plane and out-of-plane deformable portion has a plurality of wave-like shapes arranged in a repeated pattern.

* * * * *